US007673265B2

(12) United States Patent
Akiba et al.

(10) Patent No.: US 7,673,265 B2
(45) Date of Patent: Mar. 2, 2010

(54) SIMULATION APPARATUS AND CONTROL METHOD OF SIMULATION

(75) Inventors: Takashi Akiba, Kanagawa-ken (JP); Takashi Miura, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 348 days.

(21) Appl. No.: 11/851,058

(22) Filed: Sep. 6, 2007

(65) Prior Publication Data

US 2009/0083682 A1   Mar. 26, 2009

(30) Foreign Application Priority Data

Sep. 7, 2006   (JP)   ............... 2006-243413

(51) Int. Cl.
*G06F 17/50* (2006.01)
*G06F 9/455* (2006.01)

(52) U.S. Cl. ............... 716/5; 703/13; 703/14; 703/23

(58) Field of Classification Search ............ 716/5; 703/13–14, 23
See application file for complete search history.

(56) References Cited

U.S. PATENT DOCUMENTS

| 6,324,495 | B1 * | 11/2001 | Steinman ............... 703/17 |
| 6,470,481 | B2 | 10/2002 | Brouhard et al. |
| 7,003,746 | B2 * | 2/2006 | Hyduke et al. ............ 716/4 |
| 7,072,825 | B2 * | 7/2006 | Wang et al. ............... 703/28 |
| 7,191,111 | B2 * | 3/2007 | Schuppe ............... 703/13 |
| 7,366,652 | B2 * | 4/2008 | Wang et al. ............... 703/28 |
| 7,424,416 | B1 * | 9/2008 | Cavanagh et al. ......... 703/13 |
| 7,480,609 | B1 * | 1/2009 | Cavanagh et al. ......... 703/23 |
| 2001/0049593 | A1 * | 12/2001 | Mc Connell et al. ...... 703/14 |
| 2002/0133325 | A1 * | 9/2002 | Hoare et al. ............ 703/17 |
| 2003/0093256 | A1 * | 5/2003 | Cavanagh et al. ......... 703/14 |
| 2005/0144585 | A1 * | 6/2005 | Daw et al. ............ 716/18 |
| 2005/0228630 | A1 * | 10/2005 | Tseng et al. ............ 703/19 |

FOREIGN PATENT DOCUMENTS

JP   2005-332162   12/2005

\* cited by examiner

*Primary Examiner*—Stacy A Whitmore
(74) *Attorney, Agent, or Firm*—Oblon, Spivak, McClelland, Maier & Neustadt, L.L.P.

(57) ABSTRACT

A simulation apparatus, including a first simulator assigning an operating cycle number, a second simulator assigning an operating cycle number, and a control portion for synchronously controlling the first simulator and the second simulator, the control portion causing communication between the first simulator and the second simulator so as to control control-information and synchronous-information of the first simulator and the second simulator, the control-information controlling operations of the first simulator and the second simulator, wherein the control portion sets up the operating cycle numbers of the first simulator and the second simulator at a first cycle value when a synchronous condition of the synchronous-information is established, the control portion sets up at least one of the operating cycle numbers of the first simulator and the second simulator at a second cycle value being larger than the first cycle value when the synchronous condition of the synchronous-information is not established.

17 Claims, 4 Drawing Sheets

US 7,673,265 B2

SIMULATION APPARATUS AND CONTROL METHOD OF SIMULATION

CROSS REFERENCE TO RELATED APPLICATION

This application is based upon and claims the benefit of priority from the prior Japanese Application (No. 2006-243413, filed Sep. 7, 2006), the entire contents of which are incorporated herein by reference.

FIELD OF THE INVENTION

The present invention relates to a simulation apparatus and a control method of simulation being used as verifying circuits in LSI development, especially, high speed simulation technology co-operating a plurality of simulators at synchronous-type simulation.

DESCRIPTION OF THE BACKGROUND

Recently, progress of semiconductor technology causes improvement of device integration so that a system LSI disposed on one chip has been enlarged. When a trouble on an architecture level is found after being formed such the system LSI on the chip, a lot of time and cost is generated for correcting the system LSI.

Therefore in such a system LSI development, improvement of design quality and development efficiency is carried out as mentioned below. First, a block or a module of the verified design is reused. Secondly, the system level is verified step by step by using a top-down design method. In the verification of the system level, total system verification technique is necessary. However, circuit scale of the objective system demand high-speed simulation technology, as increasing with a simulation time by simulator verification.

A hardware emulator, for example, a simulation accelerator or the like is used in high-speed simulation technology. The hardware emulator performs simulation by using a cycle base simulator treating the simulator as cycle accuracy or the like, or a programmable device, for example, a FPGA (Field Programmable Gate Array).

The hardware emulator is operated with several digits of higher speed as comparing with the speed of a software simulator, however, the hardware emulator is restricted to emulate in a circuit scale from the view point of the cost or the number of the programmable device. Therefore, a hardware-software co-simulator having a capability of being simulated by harmonizing between the hardware emulator and the software simulator is proposed in Japanese patent Publication (Kokai) No. 2005-332162.

In processing steps to simulate by harmonizing the hardware emulator and the software simulator, generally, a communication speed between the hardware emulator and the software simulator is later than the simulator speeds of the hardware emulator and the software simulator, respectively. Consequently, the communication speed becomes a bottleneck so that a problem, which means the simulator speed is lowered, is generated.

Then, technique is known that the simulator speed is improved by decreasing communication amount as an approach. In the decrease of communication amount, the software simulator includes only the changed signals in output signals from the hardware emulator to the software simulator.

On the other hand, the method disclosed in Japanese patent Publication (Kokai) No. 2005-332162 has synchronous between the hardware emulator and the software simulator. Because the software simulator decreases communication amount of the co-simulation by incorporate only varied signals so as to make the co-operation speed high.

As a result, synchronous signals are served from the software simulator to the hardware emulator at every cycle. The result provides generation of communication by the synchronous signals at every cycle so as to decrease the co-simulation speed.

SUMMARY OF INVENTION

According to an aspect of the invention, there is provided a simulator, including a first simulator assigning an operating cycle number, a second simulator assigning an operating cycle number, and a control portion for synchronously controlling the simulators, the control portion causing communication between the first simulator and the second simulator so as to control control-information and synchronous-information of the first simulator and the second simulator, the control-information controlling operations of the simulator and the second simulator, wherein the control portion sets up the operating cycle numbers of the first simulator and the second simulator at a first cycle value when a synchronous condition of the synchronous-information is established, the control portion sets up at least one of the operating cycle numbers of the first simulator and the second simulator at a second cycle value being larger than the first cycle value when the synchronous condition of the synchronous-information is not established.

Further, another aspect of the invention, there is provided a simulator including, a first simulator assigning a first operating cycle number, a second simulator assigning a second operating cycle number, and a control portion for synchronously controlling the first simulator and the second simulator, the control portion causing communication between the first simulator and the second simulator so as to control control-information and synchronous-information of the first simulator and the second simulator, the control-information controlling operations of the first simulator and the second simulator, wherein the control portion sets up the operating cycle numbers of the first simulator and the second simulator at a first cycle value when a synchronous condition of the synchronous-information is established, the control portion sets up at least one of the operating cycle numbers of the first simulator and the second simulator at a second cycle value being larger than the first cycle value when the synchronous condition of the synchronous-information is not established.

Further, another aspect of the invention, there is provided a method for controlling simulation including co-operating between a first simulator and a second simulator, each of the simulators assigning operating cycle numbers by controlling of a simulation controller, comprising, the first simulator and the second simulator responding to control-information and synchronous-information, the first simulator and the second simulator inputting node data included in the synchronous-information, the first simulator and the second simulator performing simulations, each of the simulations having an operating cycle number including the control-information, after the simulating operation the first simulator and the second simulator sending the node data corresponding to the synchronous-information for the simulation controller, the simulation controller sets up a next operating cycle number set up at the first simulator and the second simulator as a first cycle value when a synchronous condition of the synchronous-information received is established, the simulation controller sets up at least one of the next operating cycle numbers set up at the first simulator and the second simulator as a second cycle value being larger than the first cycle value when the synchronous condition of the synchronous-information is not established.

DETAILED DESCRIPTION OF THE INVENTION

Figure 1:
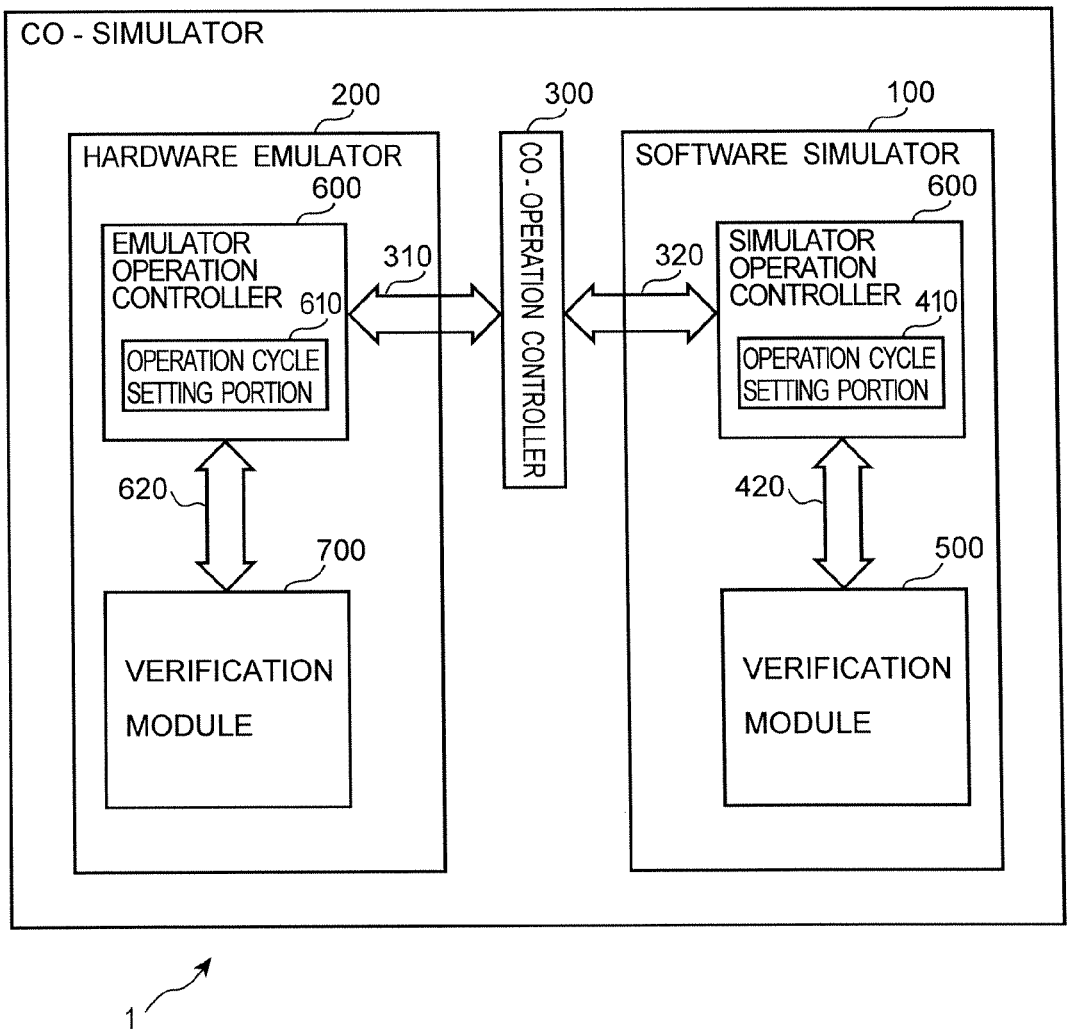
FIG. 1 is a block diagram showing a system of a co-simulator in an embodiment of the present invention.

An embodiment of the present invention will be described below in detail with reference to the attached drawings.

It should be noted that the present invention is not restricted to the embodiment but covers their equivalents. Throughout the attached drawings, similar or same reference numerals show similar, equivalent or same components.

First, a co-simulation apparatus and a co-simulation control method according to the embodiment of the present invention will be described below in detail with reference to FIG. 1 to FIG. 4.

Figure 2:
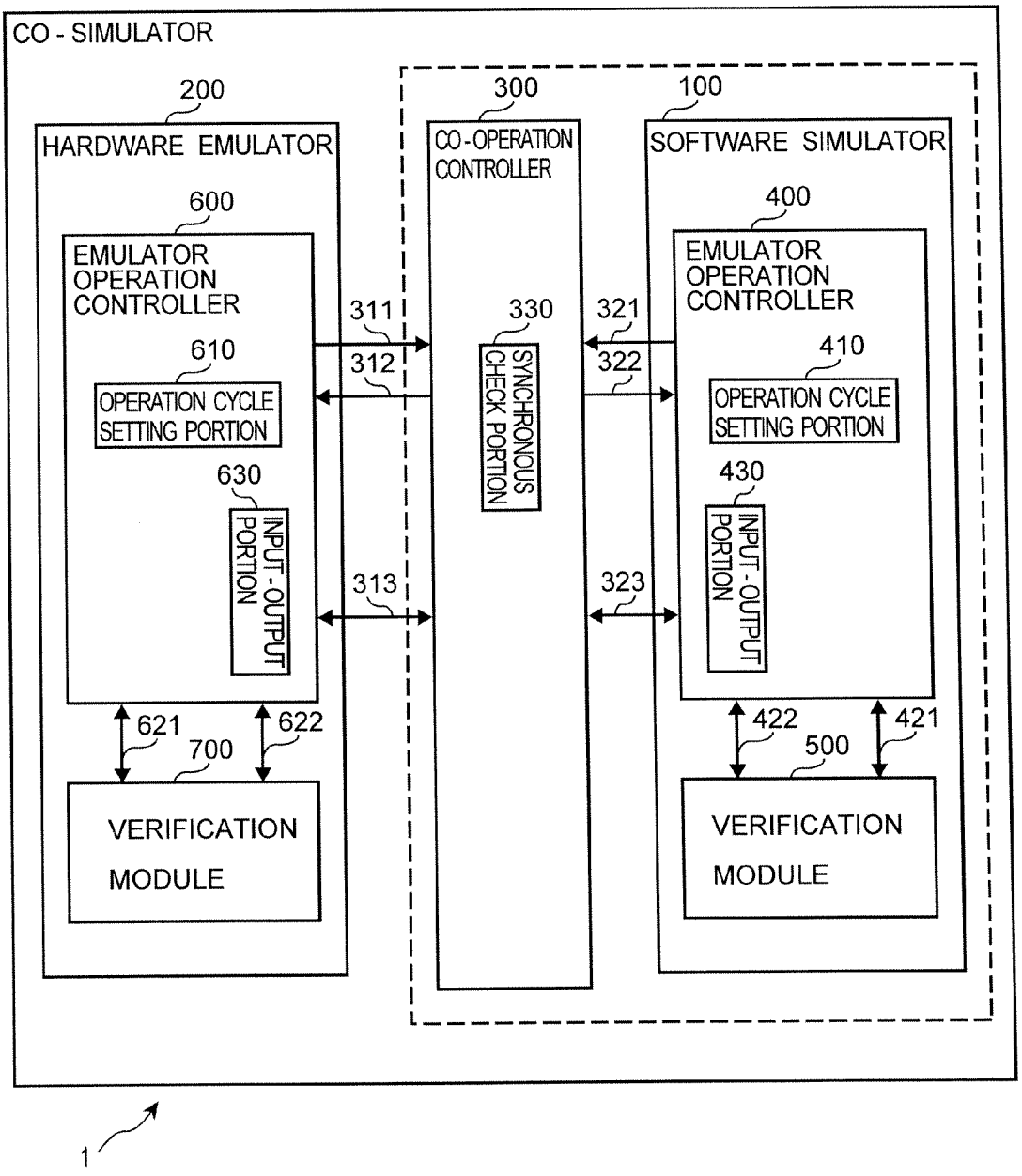
FIG. 2 is a block diagram showing a main system of the co-simulator in the embodiment of the present invention.
Figure 3:
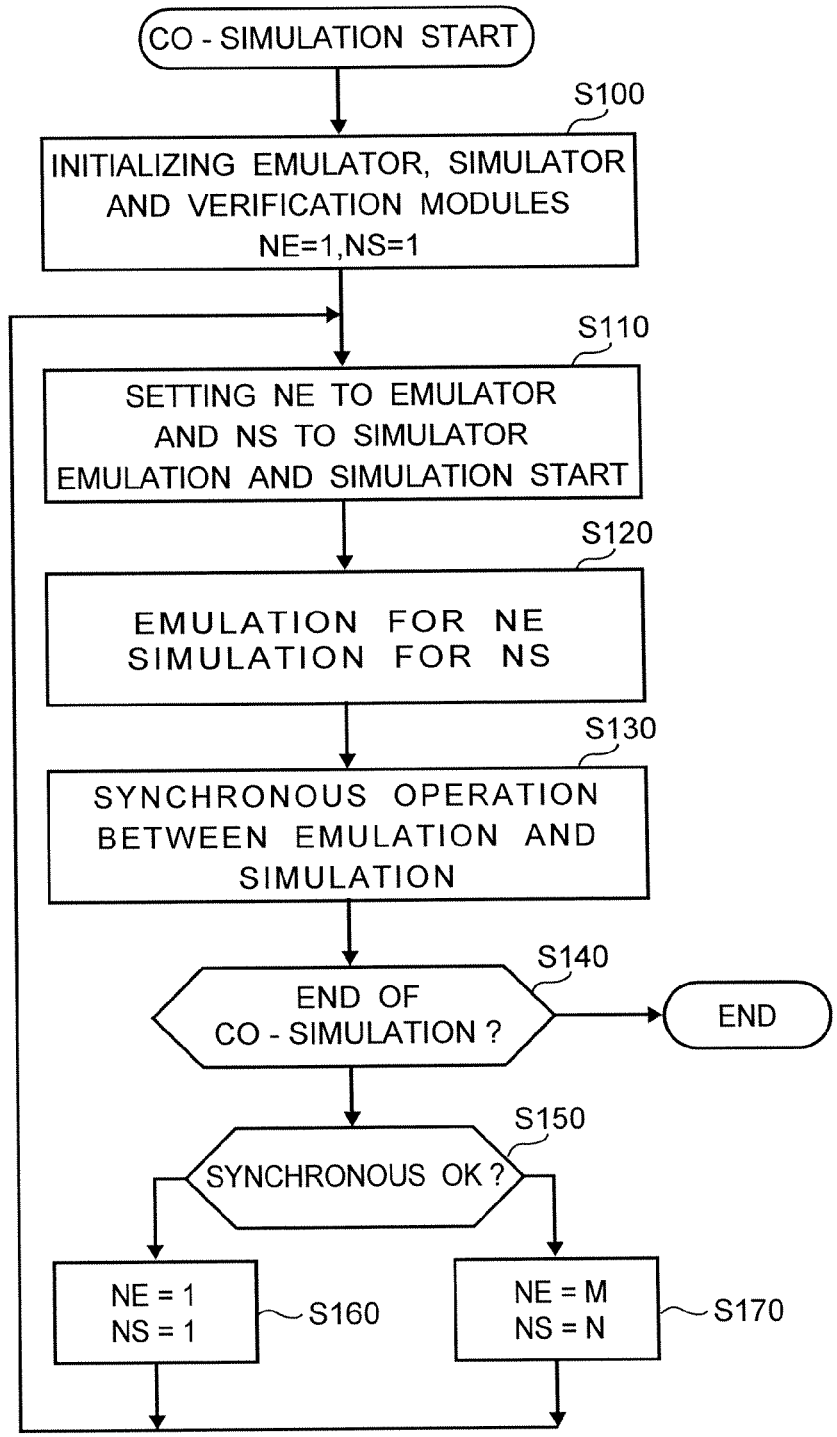
FIG. 3 is a flow chart showing a main control procedure in the embodiment of the present invention.
Figure 4:
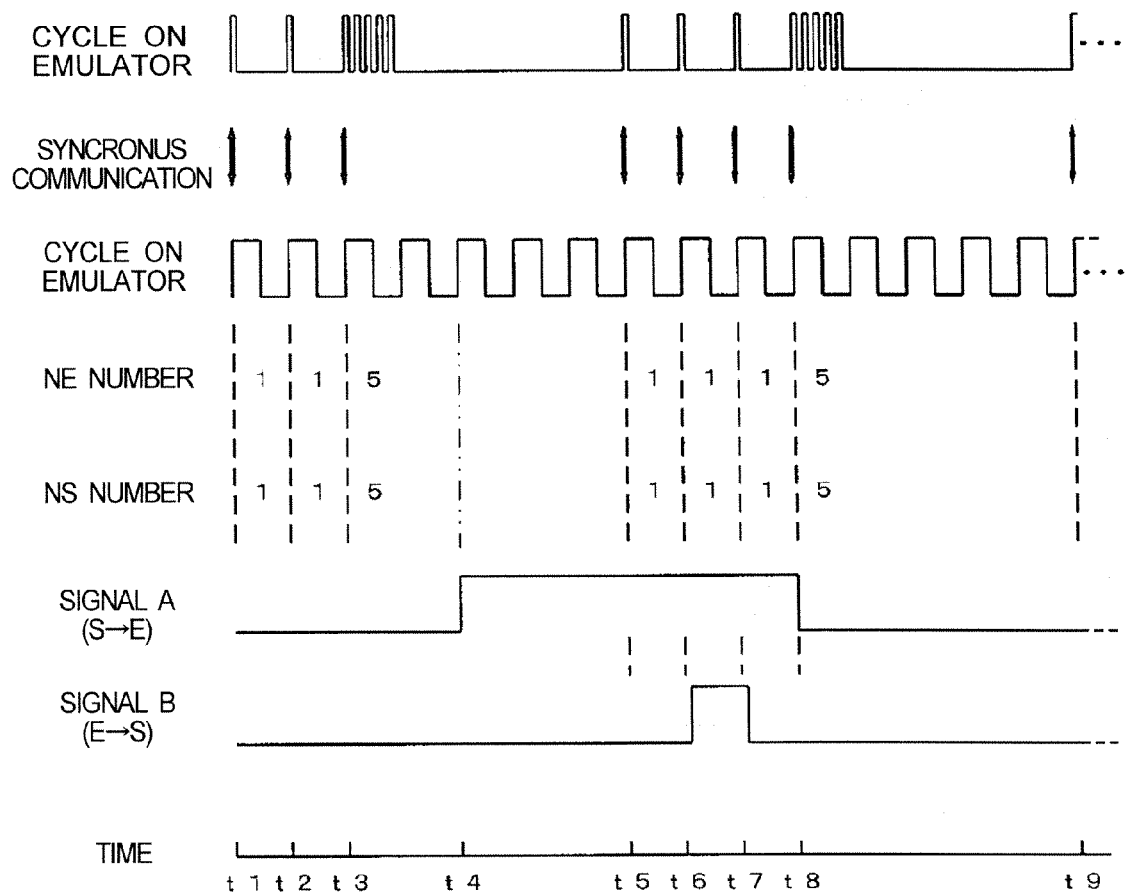
FIG. 4 is a timing chart showing a co-operation of the co-simulator in the embodiment of the present invention.

FIG. 1 is a block diagram showing a system of the co-simulation apparatus (called the co-simulator) co-simulating between a software simulator and a hardware emulator in the embodiment of the present invention. FIG. 2 is a block diagram showing a main system of the co-simulator in the embodiment of the present invention. FIG. 3 is a flow chart showing a main control procedure in the embodiment of the present invention. FIG. 4 is a timing chart showing a co-operation of the co-simulator in the embodiment of the present invention.

As shown in FIG. 1, a co-simulator 1 is a simulator to verify a total function operation in a development system. The co-simulator 1 is composed of a software simulator 100, a hardware emulator 200 and a co-operation controller 300.

The software simulator 100 performs a simulating operation (pseudo-operation) on a verification module 500 by a cycle base of a simulator software (program) according to a control of a simulator operation controller 400. The software simulator 100 is memorized in a memory device of a computer (not shown) as a data structure and a program. A simulation is realized by performing the program on a CPU in the computer.

The simulator operation controller 400 controls the simulating operation by outputting and inputting output-input information, clocks, state information, control information and the like with a verification module 500 via a signal line 420 in a period of a cycle number set in a setting portion 410.

The verification module 500 stores a function description and an operation model. The function description means a verification object, for example a peripheral circuit, a CPU, and a memory memorized a program image executed by the CPU. The operation model is transformed by a compiler or the like so as to be able to perform the simulating operation on a logic description by software.

The hardware emulator 200 performs simulating operation according to control of emulator operation controller 600 by operating a circuit built in a hardware of a verification module 700.

The emulator operation controller 600 controls the simulating operation by outputting and inputting output-input information, clocks, state information, control information and the like with a verification module 700 via a signal line 620 in a period of a cycle number set in a setting portion 610.

The simulator operation controller 400 controls the emulator operation controller 600 operating on the computer (not illustrated).

The verification module 700 is built in a programmable device, such as a FPGA or the like, by transforming an operation model into a connection description by a compiler or the like. The operation model is represented as a function description or a logic description such as a verification object, for example a peripheral circuit or a CPU, or a memory memorizing a program image executed by the CPU or the like.

Furthermore, a memory device, a hardware module being obtainable or the like except the programmable device are built in the verification module 700.

The co-operation controller 300 is operated in the computer (not illustrated) and is connected with the emulator operation controller 600 in the hardware emulator 200 via the signal line 310. Furthermore, the co-operation controller 300 is connected with the simulator operation controller 400 in the software simulator 100 via the signal line 320.

An operation instruction of a simulating operation in the co-simulator 1 is performed by a verification operator. The co-operation controller 300 inputs or outputs, which means communication, synchronous information and control information between the simulator operation controller 400 and the emulator operation controller 600 via signal line 320 and signal line 310, respectively, so as to control the simulating operation of the software simulator 100 and the hardware emulator 200. By using the synchronous information and the control information input or output, the simulating operation is performed on the total verification objection system incorporated in the verification module 500 and the verification module 700.

The synchronous information transform an identical signal included in each of the verification modules 500 and 700 into the identical value. Further, the synchronous information are output-input information communicated between the verification module 500 and the verification module 700 or the like. Moreover, the control information controls for a simulating operation. The control information is information to instruct start or stop of the simulating operation, the information showing an operating situation or information of an operation cycle number to instruct a simulating operation period.

Next, the construction of the co-simulator 1 in detail is explained according to FIG. 2. The co-operation controller 300 of the co-simulator 1 in FIG. 2 is operated on the same computer as the software simulator 100 being operated as shown by being surrounded by the dot line.

The software simulator 100 performs the simulation. In the simulation, the simulator operation controller 400 connected by the co-operation controller 300 and signal line 320 is connected with the verification module 500 and the signal line 420.

The signal line 320 is composed of the signal 321 showing the operation situation or the like, the signal 322 assigning start of simulating operation or an operation cycle number of software simulator 100, and an input-output signal 323 to a synchronous object node or the like. The input-output signal 323 is a signal for obtaining synchronous by setting up the node of the verification module 700 having the identical node in the input-output node (terminal) of the verification module 500 at the identical value.

Further, a signal line 420 is composed of a signal 421, a signal 422 or the like. The signal 421 shows a clock signal generated and output by the simulator operation controller 400 corresponding to a cycle number configured to the setting portion 410, simulating operation state of the verification module 500 or the like. The signal 422 is an input-output node of synchronous object. In these signals, the signal 422 is input into and output from the co-operation controller 300 as the input-output signal 323 via a signal input-output portion 430.

The hardware emulator 200 performs the simulation. In the simulation, the simulator operation controller 600 connected by the co-operation controller 300 and the signal line 310 connects the verification module 700 and a signal line 620.

The signal line 310 is composed of a signal 311, a signal 312, an input-output signal 313 or the like. The signal 311 shows an operation state of the hardware emulator 200. The signal 312 assigns start of simulating operation or an operation cycle number of software simulator 200. The input-output signal 313 input a synchronous object node or the like is a signal for obtaining synchronous by setting up the node of the verification module 700 having the identical node in the input-output node (terminal) of the verification module 500 at the identical value.

Further, a signal line 620 is composed of a signal 621, a signal 622 or the like. The signal 621 shows a clock signal generated and output by the simulator operation controller 600 corresponding to a cycle number configured to the setting portion 610, simulating operation state of the verification module 700 or the like. The signal 622 is an input-output node of synchronous object. In these signals, the signal 622 is input into and output from the co-operation controller 300 as the input-output signal 323 via a signal input-output portion 630.

The co-operation controller 300 is connected with the emulator operation controller 600 of the hardware emulator 200 and the simulator operation controller 400 of the software simulator 100 via the signal lines 310 and 320, respectively. A synchronous judgment portion 330 of the controller co-operation 300 is input a value with a synchronous condition corresponding to each prescribed signal. The synchronous judgment portion 330 compares the operated result with the input value so as to judge on the synchronous condition. The judgment is performed after simulating operation of the assigned cycle number output from the software simulator 100 and the hardware emulator 200. The co-operation controller 300 outputs control information of the simulating operation into the simulator operation controller 400 and the emulator operation controller 600 by the signal 322 and the signal 312 according to the judgment by the synchronous judgment portion 330.

The co-operation controller 300 of the co-simulator 1 in FIG. 2 is operated on the same computer as the software simulator 100 being operated as shown by being surrounded by the dot line. The co-operation controller 300 realizes input and output between the software simulator 100 and the simulator operation controller 400 of the software simulator 100 by writing in or reading out a data table prepared on the computer (not illustrated) each other.

Next, the co-simulating operation will be described below in detail with reference to FIG. 3 to FIG. 4. The software simulator 100 and the hardware emulator 200 co-simulates by the co-simulator 1.

FIG. 3 is a flow chart showing a main control procedure which the co-operation controller 300 of the co-simulator 1 is carried out. FIG. 4 is a timing chart showing the operation and the synchronous communication between the software simulator 100 and the hardware emulator 200.

When the co-simulation starts, the software simulator 100 including the verification module 500, the hardware emulator 200 including the verification module 700 and the co-operation controller 300 are initialized (step S100).

The initialization means to allow the use of the system and the block which are objects. The initialization of the co-operation controller 300 means to initialize a simulator time for the co-simulation control, a data table, a parameter or the like which are necessary for the co-simulation control as the setting value. Further, {1} is set up as a parameter NS and a parameter NE in the initialization. The parameter NS retains a simulating operation cycle number of the software simulator 100 and the parameter NE retains a simulating operation cycle number of the hardware emulator 200.

Next, the co-operation controller 300 sets up {1} set up at the parameter NS and the parameter NE, respectively, in the operation cycle setting portion 410 of the software simulator 100 and the operation cycle setting portion 610 of the hardware emulator 200. Subsequently, the software simulator 100 and the hardware emulator 200 start the simulating operation (step S110).

Namely, the co-operation controller 300 transmits the operation cycle number and the starting instruction of the simulating operation of the parameter NS into the simulator operation controller 400 via the signal line 322. Further, the co-operation controller 300 transmits the operation cycle number and the simulating operation start instruction of the parameter NE into the emulator operation controller 600 via the signal line 312.

Moreover, the simulator operation controller 400 sets up the parameter NS value {1} received from the operation cycle setting portion 410 and starts the simulating operation received according to the starting instruction. Further, the emulator operation controller 600 sets up the parameter NE value {1} received from the operation cycle setting portion 610 and the emulator operation controller 600 starts the emulation operation according to the starting instruction.

Next, the software simulator 100 performs the simulating operation of a cycle with several minutes set up in the operation cycle setting portion 410. The hardware emulator 200 performs the simulating operation of a cycle with several minutes in the operation cycle setting portion 610 (step S120).

Namely, the simulator operation controller 400 generates a clock according to the operation starting instruction on the simulation and inputs the operation start instruction into the verification module 500 via the signal line 421 so as to start the simulating operation of the software simulator 100.

Further, the simulating operation control portion 400 generates the clock till the cycle set in the operation cycle setting portion 410 is completed. The simulating operation control portion 400 repeatedly controls the simulating operation. Finally, the simulating operation is ended when the generated clock reaches the number set up.

Further, the emulation operation control portion 600 generates a clock according to the operation start instruction on the simulator, and inputs the operation start instruction into the verification module 700 via the signal line 621 so as to start the simulating operation of the hardware emulator 200.

Further, the emulation operation control portion 600 generates the clock till the cycle set in the operation cycle setting portion 610 is completed. The emulation operation control portion 600 repeatedly controls the simulating operation. Finally, simulating operation is ended when the generated clock reaches the number set up.

Next, the software simulator 100 and the hardware emulator 200 perform the simulating operation with the cycle number and perform the synchronous operation according to control of the co-operation controller 300 (step S130).

Namely, after ending the simulating operation of the step S120, the software simulator 100 and the hardware emulator 200 transmit, respectively, the simulating operation into the co-operation controller 300. When the co-operation controller 300 receives both end signals of the simulating operation, the co-operation controller 300 starts communication of the synchronous operation. In this case, the operating time of the software simulator 100 is different from that of the hardware emulator 200 depending upon each of circuit scale and operation cycle number on the simulating operation. Namely, the simulating operation speed of the hardware emulator 200 is approximately 100-1,000 digits larger than that of the software simulator 100. Therefore, under the co-operating system between the software simulator 100 and the hardware emulator 200, the co-operation controller 300 controls to perform the communication of the synchronous operation till the simulating operation of the software simulator 100 is ended.

Here, the synchronous operation means that nodes set up as the same node names of the verification module 500 and the verification module 700 are set to up as the same value. Namely, signal value with the same node is communicated between the verification module 500 and the verification module 700 via the signal line 422, the signal line 323, the signal line 313 and the signal line 622. When the signal value is the same, retaining the synchronous state is judged. When the signal value is different from the synchronous operation, the synchronous is retained by renewing the input value.

Further, a prescribed input-output signal in objective signals as the synchronous operation is input into the synchronous judgment portion 330 with the prescribed synchronous condition.

Next, the co-operation controller 300 judges whether an end condition of the co-simulation is established or not (step S140). When the end condition is not established, the procedure proceeds to the next step S150. On the other hand, when the end condition is established, the co-simulation is ended.

Establishment of the end condition on the co-simulation means, for example, a case that a CPU included in the module executes a HALT instruction, a case that a system cycle number of the co-simulator reaches the cycle number specified at the starting point of the simulator or a case that the simulator operation is stopped from an input apparatus (not illustrated). The co-operation controller 300 stops the simulating operation of the software simulator 100 and the hardware emulator 200 corresponding to the end condition established and ends the co-simulating operation.

When the end condition of the co-simulation is not established, the co-operation controller 300 studies whether a synchronous condition is established or not by output of the synchronous judgment portion 330 (step S150). When the synchronous condition is established, the procedure proceeds to step S160. On the other hand, the synchronous condition in not established, the procedure goes to step S170.

A group of signals is input and sets up in the synchronous judgment portion 330. One is the signal prescribed in synchronous signals by a verification operator or the like before the co-simulation starts. The other is the signal shown a signal level at the synchronous establishment. The synchronous judgment portion 330 outputs an active (High) signal, when signals of the groups agree with even one group. On the other hand, synchronous judgment portion 330 outputs a non-active (Low) signal, when the signals of the groups disagree with all groups input the signals.

Further, when the synchronous condition is established, the co-operation controller 300 sets up {1} into the synchronous cycle parameters NE and NS of the software simulator 100 and the hardware emulator 200, and the procedure returns step S110 (step S160).

Further, when the synchronous condition is not established, the software simulator 100 and the hardware emulator 200 perform each other simulating operation by non-synchronous, in period of N-cycle and M-cycle, respectively. The {N} and the {M} are set up into the parameter NS and the parameter NE, respectively (step S170) and return step S110.

At least one of the non-synchronous cycle value {N} and {M} is more than two, integer number and the cycle number where the software simulator 100 and the hardware emulator 200 performs the simulating operation at non-synchronous. The non-synchronous cycle value {N} and {M} are input and set up into the co-operation controller 300 from an input apparatus (not illustrated). FIG. 4 is the co-simulation as an example showing a case being set up five into the {N} and the {M} as values.

Next, with reference to the timing chart in FIG. 4, an operation and a synchronous communication of the software simulator 100 and the hardware emulator 200 is explained at an execution of the co-simulation. The time from t1 to t9 in FIG. 4 is shown as a temporary sequence when the co-simulation is executed. The time is not shown a time interval as the operation.

The communication, which is called as a synchronous communication 300 below, is for a synchronous operation of an objective signal between the software simulator 100 and the hardware emulator 200. At the time t1, it is assumed that the synchronous condition of the synchronous objective signal is established. The co-operation controller 300 performs to set up NS value {1} of the step S160 in the operation cycle setting portion 410 of the simulator operation controller 400 with the synchronous operation and NE value {1} of the step S160 in the operation cycle setting portion 610 of the emulator operation controller 600. Subsequently, the co-operation controller 300 starts the next simulating operation.

Next, the time t2 is defined as just the time which one cycle of the simulating operation is finished by the software simulator 100. The co-simulator 1 performs synchronous communication between the software simulator 100 and the hardware emulator 200. At the time t2, it is assumed that the synchronous condition of the synchronous objective signal is established. The co-operation controller 300 performs to set up NS value {1} of the step S160 in the operation cycle setting portion 410 of the simulator operation controller 400 with the synchronous operation and NE value {1} of the step S160 the operation cycle setting portion 610 in the emulator operation controller 600.

Next, the time t3 is defined as just the time which one cycle of the simulating operation is finished by the software simulator 100. The co-simulator 1 performs synchronous between the software simulator 100 and the hardware emulator 200.

At the time t3, it is assumed that the synchronous condition of the synchronous signal is established. The co-operation controller 300 performs to set up NS value {5} of the step S170 in the operation cycle setting portion 410 of the simulator operation controller 400 with the synchronous operation and NE value {1} of the step S170 the operation cycle setting portion 610 in the emulator operation controller 600. As a result, the software simulator 100 and the hardware emulator 200 respectively execute the simulating operation.

Next, the time t4 is defined as just the time which two cycles of the simulating operation is finished by the software simulator 100. In the period which being performed the simulating operation, the software simulator 100 reaches the time t4 and the signal A of the verification module 500, respectively, is assumed to be at high. The signal A is one of output signals assigned as a synchronous objective signal and the synchronous condition is assumed to be at High. However, as the simulating operation of the software simulator 100 is set at 5 cycles, the synchronous communication between the co-operation controllers 300 is not carried out till the time t5.

Further, when the time t5 comes on, co-simulator 1 performs the synchronous communication between the software simulator 100 and the hardware emulator 200 according to the control of the co-operation controller 300. At the time, as the signal A is at high so as to approve with synchronous condition as high, the synchronous condition is established as the signal A. Accordingly, the co-operation controller 300 performs the synchronous operation to be input value of the signal A in the verification module 700 of the hardware emulator 200 as high. Furthermore, the co-operation controller 300 sets up the NS value {1} of the step S160 in the operation cycle setting portion 410 of the simulator operation controller 400 and the NE value {1} of the step S160 in the operation cycle setting portion 610 of the simulator operation controller 600 so as to start the next simulating operation.

Next, the time t6 is defined as just the time which one cycle of the simulating operation is finished by the software simulator 100. At the time t6, it is assumed that the synchronous condition of the signal A is established. The co-simulator 1 performs synchronous communication between the software simulator 100 and the hardware emulator 200 so as to start the next simulating operation. The co-operation controller 300 performs to set up NS value {1} of the step S160 in the operation cycle setting portion 410 of the simulator operation controller 400 with the synchronous operation and NE value {1} of the step S160 of the operation cycle setting portion 610 in the emulator operation controller 600. In this case, the hardware emulator 200 set up the signal B corresponding with the signal A at high, as the input of the signal A of the verification module 700 is high, when one cycle of the simulator in the operation is finished. A circuit established in the module 700 generates a response signal used in the synchronous system between the systems. Therefore, when the input signal A is up to high, the output of the signal B is up to high.

Next, the time t7 is defined as just the time which one cycle of the simulating operation is finished by the software simulator 100. At the time t7, it is assumed that the synchronous condition of the signal A is established. The co-simulator 1 performs synchronous communication between the software simulator 100 and the hardware emulator 200 according to the control of the co-operation controller 300. Namely, the co-operation controller 300 decides an output value of the signal B, the synchronous signal in the verification module 700 of the hardware emulator 200, as high. As a result, the input value of the signal B in the verification module 500 of the software simulator 100 is set up at High.

In the time t7, as the synchronous condition of the signal A is established, the NS value {1} of the step S160 is set up in the operation cycle setting portion 410 of the simulator operation controller 400 and NE value {1} of the step S160 is set up in the operation cycle setting portion 610 of the emulator operation controller 600. Subsequently, the next simulating operation is started.

In this case, the software simulator 100 set up the signal A corresponding with signal B at low, as the input of the signal B of the verification module 500 is low, when one cycle of the simulator in the operation is finished. A circuit established in the module 500 is an operation model used in the synchronous system between the systems. Therefore, when the input signal B is up to high, the input signal B is down to low.

In this case, the hardware emulator 200 set up the signal B of the verification module 700 to low when one cycle of the simulating operation is finished. A circuit established in the module 700 is constituted that the signal B outputs high in the only one cycle and return low again.

Next, the time t8 is defined as just the time which one cycle of the simulating operation is finished by the software simulator 100. The co-simulator 1 performs synchronous between the software simulator 100 and the hardware emulator 200. At the time t8, it is assumed that the signal A becomes low so as to be not established the synchronous condition of the all synchronous signals. The co-operation controller 300 performs to set up NS value {5} of the step S170 in the operation cycle setting portion 410 of the simulator operation controller 400 with the synchronous operation and NE value {1} of the step S170 in the operation cycle setting portion 610 in the emulator operation controller 600. As a result, the software simulator 100 and the hardware emulator 200, respectively, execute the simulating operation.

The co-operation controller 300 controls the synchronous communication of the synchronous operation between the software simulator 100 and the hardware emulator 200 mentioned above. When the synchronous condition is established, the co-operation controller 300 performs simulation at every cycle by synchronous communication accompanying with assuring accuracy of function equivalent of the co-simulation. On the other hand, the synchronous condition is not establish, co-operation controller 300 performs simulation each other at every cycle without the synchronous communication and performs synchronous communication after the predetermined cycle. Accordingly, the time for performing the synchronous communication is reduced so that a total speed of the co-simulation can be improved.

Further, in the explanation of the synchronous operation mentioned above, the same node name communicates between the verification module 500 and the verification module 700 via the signal line 422, signal line 323, signal line 313 and signal line 622. However, a detecting circuit may be set up at the signal input-output portion 630 and the signal input-output portion 430 to detect a variation of an output value of the synchronous node with the same node name so as to only communicate between the varied node name and the signal value. For example, the detect circuit is composed of a memory circuit, a comparative circuit or the like. The memory circuit memorizes the output value of the synchronous communication. As a result, communication amount of one synchronous communication is reduced so that the time interval for the synchronous communication is also decreased, which leads to improve the total speed of the co-simulation.

Other embodiments of the present invention will be apparent to those skilled in the art from consideration of the specification and practice of the invention disclosed herein. It is intended that the specification and example embodiments be considered as exemplary only, with a true scope and spirit of the invention being indicated by the claims that follow. The invention can be carried out by being variously modified within a range not deviated from the gist of the invention.

For example, a second non-synchronous cycle values {N2} and {M2} are set up in the co-operation controller 300. When the synchronous condition is not established, the co-operation controller 300 controls to set up a smaller value in {N} and {N2} as the parameter NS and a smaller value in {M} and {M2} as the parameter NE in the step S170. The value {N2} is set up by a program being executed by the CPU be simulated by the software simulator 100. The value {M2} is composed to be set by a program executed by the CPU operated by the hardware emulator 200.

For example, when the program being executed by the CPU simulated by the software simulator 100 becomes a program loop, which means to wait data-input from the verification module 700 of the hardware emulator 200, a cycle number executing the program loop is set up to N2.

In this way, the hardware emulator 200 operates non-synchronous for M cycle and the software simulator 100 operates non-synchronous for N2 cycle in the period being executed the program loop. As the co-operation controller 300 performs the synchronous communication at every the program loop cycle number N2 not every N cycle determined by system constitution, an empirical value or the like. Before the software simulator 100 is finished to operate an unfruitful cycle of the simulation of the software simulator 100. The simulating operation of the program inputting data being output by the verification module 700 of the hardware emulator 200 can be promoted to improve the total speed of the co-simulation.

What is claimed is:

1. A simulation apparatus, comprising:
   a first simulator assigning a first operating cycle number;
   a second simulator assigning a second operating cycle number; and
   a control portion for synchronously controlling the first simulator and the second simulator, the control portion causing communication between the first simulator and the second simulator so as to control control-information and synchronous-information of the first simulator and the second simulator, the control-information controlling operations of the first simulator and the second simulator,
   wherein the control portion sets up the operating cycle numbers of the first simulator and the second simulator at a first cycle value when a synchronous condition of the synchronous-information is established, the control portion sets up at least one of the operating cycle numbers of the first simulator and the second simulator at a second cycle value being larger than the first cycle value when the synchronous condition of the synchronous-information is not established.

2. The simulation apparatus according to claim 1,
   wherein the first simulator is a software simulator and the second simulator is a hardware emulator.

3. The simulation apparatus according to claim 1,
   wherein the second cycle value is increased when each of the operating cycle numbers is set up at the first simulator and the secondly simulator.

4. The simulation apparatus according to claim 2,
   wherein the first cycle value or the second cycle value are set up from a program executing on the software simulator.

5. The simulation apparatus according to claim 2,
   wherein the software simulator and the hardware emulator respectively include an input-output signal portions, each of the input-output signal portions including a detecting circuit.

6. The simulation apparatus according to claim 5
   wherein each of the detecting circuits includes a memory and a comparative circuit.

7. A simulation apparatus, comprising:
   a first simulator assigning a first operating cycle number;
   a second simulator assigning a second operating cycle number; and
   a control portion for synchronously controlling the first simulator and the second simulator, the control portion causing communication between the first simulator and the second simulator so as to control control-information and synchronous-information of the first simulator and the second simulator, the control-information controlling operations of the first simulator and the second simulator,
   wherein the control portion sets up the operating cycle numbers of the first simulator and the second simulator at a first cycle value when a synchronous condition of the synchronous-information is established, the control portion sets up the operating cycle numbers of the first simulator and the second simulator at a second cycle value and at a third cycle value, respectively, compares the second cycle value and the third cycle value with the first cycle value, respectively, and sets up each of the smaller values at the cycle values of the first simulator and the second simulator, when a synchronous condition of the synchronous-information is not established.

8. The simulator according to claim 7,
   wherein the first simulator is a software simulator and the second simulator is a hardware emulator.

9. The simulator according to claim 8,
   wherein the first cycle value or the second cycle value is set up from a program executing on the software simulator, and the third cycle value is set up from a CPU executing on the hardware emulator.

10. The simulator according to claim 8,
    wherein the software simulator and the hardware emulator respectively include an input-output signal portions, each of the input-output signal portions including a detecting circuit.

11. The simulator according to claim 8,
    wherein each of the detecting circuits includes a memory and a comparable circuit.

12. A method for controlling simulation including co-operating between a first simulator and a second simulator, each of the first simulator and the second simulator assigning operating cycle numbers by controlling of a simulation controller, comprising;
    the first simulator and the second simulator responding to control-information and synchronous-information,
    the first simulator and the second simulator inputting node data included in the synchronous-information, the first simulator and the second simulator performing simulations, each of the simulations having an operating cycle number including the control-information, after the simulating operation the first simulator and the second simulator sending the node data corresponding to the synchronous-information for the simulation controller,
    the simulation controller sets up a next operating cycle number set up at the first simulator and the second simulator as a first cycle value when a synchronous condition of the synchronous-information received is established, the simulation controller sets up at least one of the next operating cycle numbers set up at the first simulator and the second simulator as a second cycle value being larger than the first cycle value when the synchronous condition of the synchronous-information is not established.

13. The method for controlling simulation, according to claim 12,
    wherein the first simulator is a software simulator and the second simulator is a hardware emulator.

14. The method for controlling simulation, according to claim 13, wherein the second cycle value is increased when each of the operating cycle numbers is set up at the first simulator and the second simulator.

15. The method for controlling simulation, according to claim 14,
wherein the first cycle value or the second cycle value is set up from a program executing on the software simulator.

16. The method for controlling simulation, according to claim 14,
wherein the software simulator and the hardware emulator respectively include an input-output signal portions, each of the input-output signal portions including a detecting circuit.

17. The method for controlling simulation, according to claim 16,
wherein each of the detecting circuit includes a memory and a comparative circuit.

* * * * *